(12) United States Patent
Yanagawa et al.

(10) Patent No.: US 10,444,031 B2
(45) Date of Patent: Oct. 15, 2019

(54) SENSOR DEVICE

(71) Applicant: Hitachi Automotive Systems, Ltd., Hitachinaka-shi, Ibaraki (JP)

(72) Inventors: Yoshimitsu Yanagawa, Tokyo (JP); Masahiro Matsumoto, Tokyo (JP); Satoshi Asano, Tokyo (JP); Hiroshi Nakano, Tokyo (JP); Akira Kotabe, Ibaraki (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 296 days.

(21) Appl. No.: 15/500,426

(22) PCT Filed: Sep. 16, 2014

(86) PCT No.: PCT/JP2014/074340
§ 371 (c)(1),
(2) Date: Jan. 30, 2017

(87) PCT Pub. No.: WO2016/042593
PCT Pub. Date: Mar. 24, 2016

(65) Prior Publication Data
US 2017/0227378 A1     Aug. 10, 2017

(51) Int. Cl.
*G05F 1/573* (2006.01)
*G01D 3/028* (2006.01)
(Continued)

(52) U.S. Cl.
CPC ............ *G01D 3/028* (2013.01); *G05F 1/569* (2013.01); *H02H 1/0007* (2013.01); *H02H 3/22* (2013.01);
(Continued)

(58) Field of Classification Search
USPC .............................. 361/18, 86–87, 93.7–93.9
See application file for complete search history.

(56) References Cited

U.S. PATENT DOCUMENTS

| 3,029,366 A | 4/1962 | Lehovec |
|---|---|---|
| 3,665,253 A | 5/1972 | Stefani |

(Continued)

FOREIGN PATENT DOCUMENTS

| CN | 1097214 C | 12/2002 |
|---|---|---|
| JP | 57-118418 U1 | 7/1982 |

(Continued)

OTHER PUBLICATIONS

Chinese-language Office Action issued in counterpart Chinese Application No. 201480081559.X dated Nov. 3, 2017 with English translation (11 pages).

(Continued)

*Primary Examiner* — Danny Nguyen
(74) *Attorney, Agent, or Firm* — Crowell & Moring LLP

(57) ABSTRACT

Provided is a sensor device wherein malfunction due to a negative surge is suppressed. This sensor device is provided with: a sensor element wherein electrical characteristics change corresponding to physical quantities; a signal processing circuit that processes output signals of the sensor element; a first transistor element that supplies currents to the sensor element and the signal processing circuit; a control circuit that controls a base current of the first transistor element; a power supply terminal; and a ground terminal. The sensor device is characterized in that the control circuit is provided with a limiting section that limits a current flowing from the ground terminal toward a base terminal of the first transistor element.

10 Claims, 13 Drawing Sheets

(51) Int. Cl.
*G05F 1/569* (2006.01)
*H02H 1/00* (2006.01)
*H02H 3/22* (2006.01)
*H02M 3/158* (2006.01)
*H02H 9/02* (2006.01)
*H02M 1/32* (2007.01)
*H03K 17/082* (2006.01)

(52) U.S. Cl.
CPC ............ *H02M 3/158* (2013.01); *G05F 1/573* (2013.01); *H02H 9/025* (2013.01); *H02M 1/32* (2013.01); *H03K 17/0822* (2013.01)

(56) References Cited

U.S. PATENT DOCUMENTS

| | | | | |
|---|---|---|---|---|
| 4,319,179 | A * | 3/1982 | Jett, Jr. | G05F 1/56 323/281 |
| 5,637,979 | A * | 6/1997 | Tamai | H01M 10/44 320/116 |
| 5,859,757 | A | 1/1999 | Hanafusa et al. | |
| 6,816,348 | B2 * | 11/2004 | Chen | H02H 11/002 361/56 |
| 7,480,126 | B2 * | 1/2009 | Cetrulo | H02H 3/202 361/91.1 |
| 2006/0151783 | A1 | 7/2006 | Otani | |
| 2007/0125161 | A1 | 6/2007 | Bryzek et al. | |
| 2013/0106369 | A1 | 5/2013 | Arunachalam et al. | |
| 2015/0028842 | A1 * | 1/2015 | Darshan | H02M 1/32 323/312 |

FOREIGN PATENT DOCUMENTS

| | | |
|---|---|---|
| JP | 58-112114 A | 7/1983 |
| JP | 62-2308 A | 1/1987 |
| JP | 3-131062 A | 6/1991 |
| JP | 2000-112540 A | 4/2000 |
| JP | 2000-312004 A | 11/2000 |
| JP | 2001-195141 A | 7/2001 |
| JP | 2001-337729 A | 12/2001 |
| JP | 2002-91582 A | 3/2002 |
| JP | 2007-156641 A | 6/2007 |
| JP | 2010-224825 A | 10/2010 |

OTHER PUBLICATIONS

Extended European Search Report issued in counterpart European Application No. 14902244.4 dated May 18, 2018 (nine pages).
Anonymous: "The Power Electronics Page", dtm Associates, Dec. 31, 2013, XP-002780587 (seven pages).
European Office Action issued in counterpart European Application No. 14902244.4 dated May 10, 2019 (nine (9) pages).
International Search Report (PCT/ISA/210) issued in PCT Application No. PCT/JP2014/074340 dated Dec. 16, 2014 with English-language translation (four (4) pages).
Japanese-language Written Opinion (PCT/ISA/237) issued in PCT Application No. PCT/JP2014/074340 dated Dec. 16, 2014 (four (4) pages).

* cited by examiner

SENSOR DEVICE

TECHNICAL FIELD

The present invention relates to a sensor device including a regulator for stabilizing a voltage, and more specifically to a sensor device with malfunction resistance to negative surge impressed to a power supply line.

BACKGROUND ART

Regulators are used to stabilize a power supply voltage to be supplied to a sensor element or a signal processing circuit and to cope with a drop of a circuit operation voltage that accompanies miniaturization of a process. Although the regulator absorbs voltage fluctuation of the power supply line and supplies a stabilized predetermined voltage to the sensor element or the signal processing circuit, when the negative surge is impressed to the power supply line, there may be a case where a current flows back in a transistor for driving a load of the regulator, and the output voltage of the regulator drops. Thereby, load circuits, such as the sensor element and the signal processing circuit, may be reset, and malfunctions, such as outputting an abnormal value and a reboot operation, may occur. In order to suppress such a malfunction, it is necessary to make the current not flow back at the time of negative surge impression. A technology described in PTL 1 includes a diode between a power supply line and a collector terminal of an NPN bipolar transistor for load driving (hereinafter referred to as NPN transistor). Since this diode prevents a reverse current that flows from the load side to the power supply line at the time of the negative surge impression, the malfunctions described above can be suppressed.

CITATION LIST

Patent Literature

PTL 1: JP 2007-156641 A

SUMMARY OF INVENTION

Technical Problem

However, in the conventional technology, since a diode exists on a power supply path leading to a load circuit, there is a problem that a voltage drop equal to a forward voltage of the diode occurs, and an output voltage range of the regulator becomes narrow. For example, denoting the input voltage as Vin, the regulator can output only about Vin-1.2 V at most. This is because the forward voltage of the diode is about 0.6 V and a voltage drop between a base and an emitter of the transistor is about 0.6 V. Although there also exists a diode with a small forward voltage like a Schottky barrier diode, since its leakage current of an opposite direction is large, it is unsuitable for a purpose of blocking a reverse current at the time of negative surge impression.

Moreover, the diode on the power supply path needs to be of a sufficient size according to a consumption current of the load circuit. When the load circuit consumes a large current, it is necessary to secure a sufficient current capacity by enlarging a size of the diode, and the size of the diode occupying a chip becomes non-negligible. From the above viewpoints, it is desirable not to insert a diode on the power supply path.

The present invention is made in view of the above-mentioned situation, and its object is to provide a sensor device that suppresses the voltage drop in the load circuit even when negative surge occurs in the power supply line and has high malfunction resistance.

Solution to Problem

The sensor device of the present invention that achieves the above-mentioned object is characterized by including a restriction part for restricting a current flowing from a ground terminal to a base terminal of a first transistor element in the control circuit.

Advantageous Effects of Invention

By the present invention, it is possible to provide a sensor device that can suppress the voltage drop in the load circuit even when the negative surge occurs in the power supply line and has the high malfunction resistance.

DESCRIPTION OF EMBODIMENTS

Figure 1:
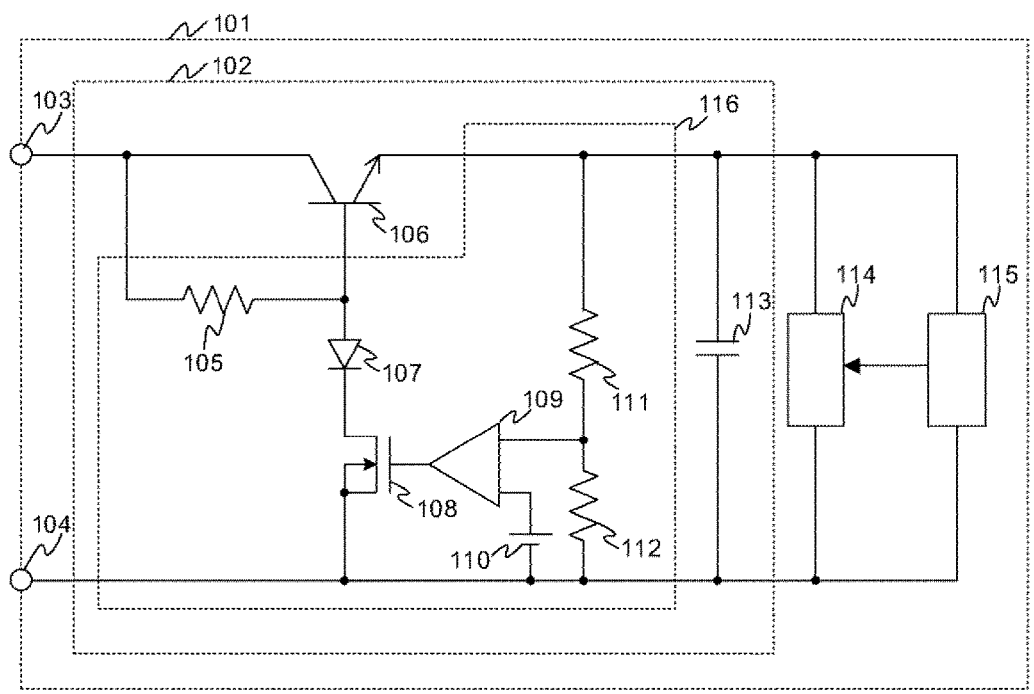
FIG. 1 is a configuration of a sensor device that forms a first embodiment.
Figure 8:
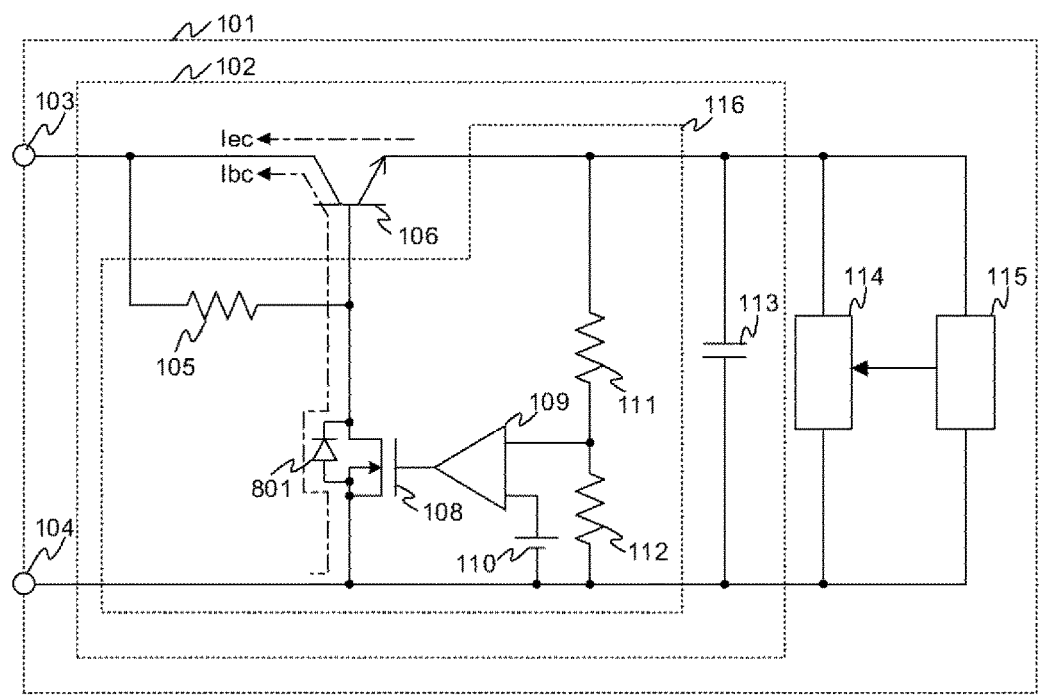
FIG. 8 is a configuration of a conventional sensor device.
Figure 9:
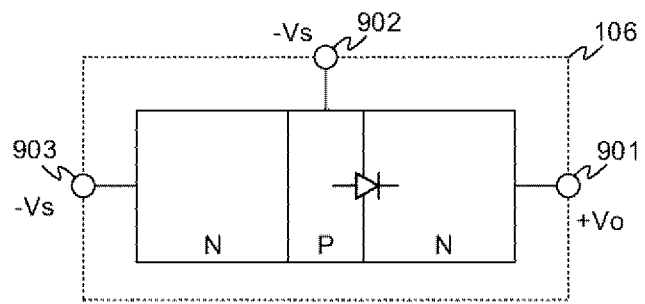
FIG. 9 is a schematic diagram of an NPN transistor.

Hereinafter, embodiments of the present invention are explained with reference to drawings. A sensor device that forms a first embodiment of the present invention is explained with FIGS. 1, 8, and 9. FIG. 1 shows a configuration of the sensor device that forms the first embodiment. FIG. 8 shows a configuration of a conventional sensor device. FIG. 9 shows a schematic structure of an NPN transistor 106.

A configuration of a sensor device in this embodiment is explained with FIG. 1. A sensor device 101 in this embodiment includes a power supply terminal 103 for supplying an input voltage Vi, a ground terminal 104, a sensor element 115 for generating an electric signal according to a physical quantity, a signal processing circuit 114 for processing the output signal from the sensor element 115, and a regulator 102 for creating a supply voltage to the sensor element 115 and the signal processing circuit 114 (hereinafter, a combination of the sensor element 115 and the signal processing circuit 114 is referred to as load circuit) from the power supply voltage Vo. The regulator 102 includes the NPN transistor 106 for driving the load circuit, an error detection circuit 116 for suppressing a base current, and a decoupling capacitor 113. The error detection circuit 116 includes resistances 111, 112 that divide an output voltage Vo of the regulator 102, a voltage reference 110, an error amplifier 109, an N-type field-effect transistor 108 (hereinafter referred to as NMOS) for suppressing a base current, a resistance 105 for supplying a base current, and a back flow preventing diode 107. Incidentally, an anode of the back flow preventing diode 107 is connected to a base of the NPN transistor 106, and is configured so as to block a reverse current that flows from the ground into the base of the NPN transistor 106 through a parasitic diode of the NMOS 108.

An operation of the sensor device in this embodiment is explained with FIG. 1 and FIG. 9. In the sensor device 101 in this embodiment, when the power supply voltage Vi is normal, the output voltage Vo that is stabilized by a feedback control of the error detection circuit 116 is supplied to the load circuit. Since generally a direct-current gain hFE of a bipolar transistor is about several tens to hundreds, a current that is to be flown in the base of the NPN transistor 106 may be several tenths to hundredths of a consumption current of the load circuit. When the consumption current of the load circuit decreases, the base current is released to the ground terminal 104 through the NMOS 108. At this time, the current flowing in the back flow preventing diode 107 is merely several tenths to hundredths of the consumption current of the load circuit. Therefore, as described in PTL 1, a current capacity of the diode 107 can be smaller about one- to two-orders of magnitude than that of a case where a diode is inserted between the power supply terminal 103 and a collector of the NPN transistor 106. As a result, an area of the diode 107 can be made smaller. Moreover, a maximum output voltage of a regulator described in PTL 1 is restricted to Vi-1.2 V obtained by subtracting the forward voltage drop about 0.6 V of the diode and the voltage drop about 0.6 V between the base and the emitter of the NPN transistor from the input voltage Vi. On the other hand, a maximum output voltage of the regulator of this embodiment is Vi-0.6 V obtained by subtracting a voltage between the base and the emitter of the NPN transistor 106 from Vi, which means the regulator can output a wider range of voltage.

Next, an operation when the input voltage Vi makes an abnormal drop by negative surge to become a negative potential −Vs is explained. When an input terminal 103 becomes the negative potential −Vs, the reverse current tends to flow from the ground terminal 104 toward the base through the parasitic diode of the NMOS 108 as will be described later. However, since the reverse current does not flow because of the back flow preventing diode 107, potentials of both a collector terminal 903 and a base terminal 902 of the NPN transistor 106 become −Vs. At this time, since the emitter terminal 901 remains at an original output voltage +Vo, a PN junction between the base and the emitter becomes a state of reverse bias, as is shown in FIG. 9. Therefore, electric charges do not flow out of the emitter, and the voltage of the emitter +Vo is maintained.

In contrast to this, an operation to the negative surge when there is no back flow preventing diode 107 is explained using FIG. 8. If the input terminal 103 becomes a negative potential −Vs by the negative surge, a reverse current Ibc will flow into the base from the ground terminal through a parasitic diode 801 of the NMOS 108. Then, since a current Iec flows from an emitter terminal 901 toward the collector terminal 903, the decoupling capacitor 113 discharges and the output voltage +Vo drops.

An effect of the sensor device in this embodiment is explained. The first effect is that a stabilized voltage can be supplied to the load circuit over a longer time by preventing electric charges stored in the decoupling capacitor 113 from following out toward the collector terminal 903 from the emitter terminal 901 of the NPN transistor 106 in the case of the negative surge being inputted. The second effect is that an output voltage range of the regulator at the time of normal operation can be secured wide by adding the back flow preventing diode 107 to the base terminal 902, not to the collector terminal 903, of the NPN transistor 106. In other words, this embodiment provides a regulator capable of operating the load circuit even with a lower input voltage. The third effect is that the current capacity required for the back flow preventing diode 107 is made small, and therefore reduction of an element area is made possible by adding the back flow preventing diode 107 to the base terminal 902, not to the collector terminal 903 of the NPN transistor 106.

Figure 2:
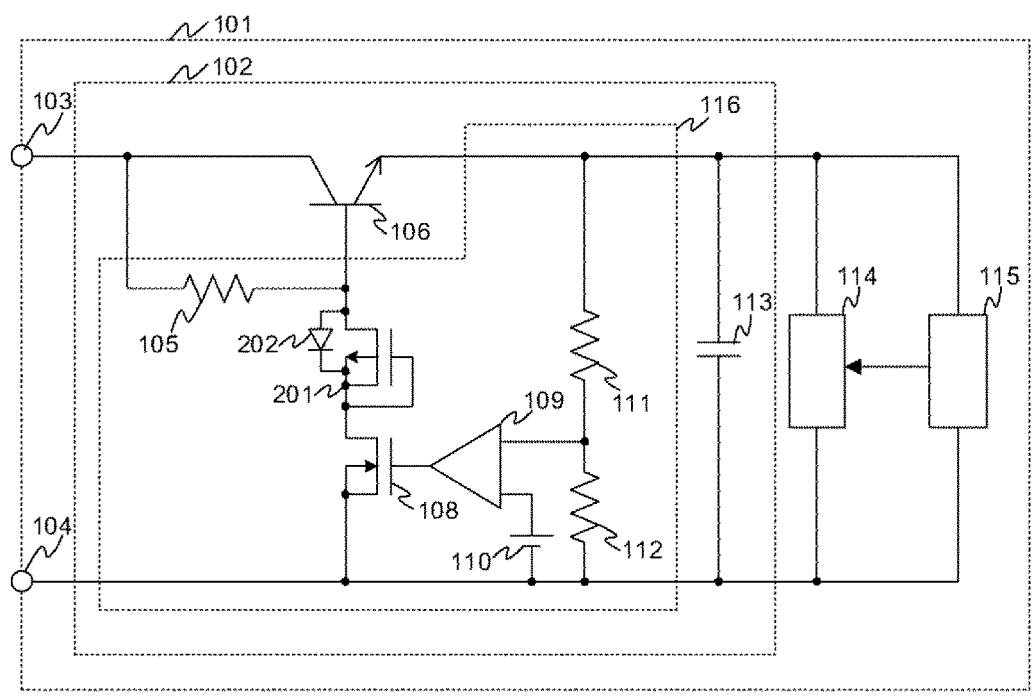
FIG. 2 is a configuration of a sensor device that forms a second embodiment.

A sensor device that forms a second embodiment of the present invention is explained with FIG. 2. FIG. 2 shows a configuration of the sensor device that forms the second embodiment. The sensor device 101 in this first embodiment is characterized by including a P-type field-effect transistor (hereinafter referred to as PMOS) 201 such that its well and gate are connected to its drain side in place of the back flow preventing diode 107 in the sensor device 101 that forms the first embodiment. According to this configuration, at the time of normal operation, it is possible to connect a base terminal 202 and the NMOS 108 at a lower resistance by a parasitic diode 202 of the PMOS 201 and the PMOS 201 in an ON state realizing parallel connection, in addition to the same effect as that of the sensor device 101 shown in the first embodiment, and therefore responsiveness of the regulator 102 can be further improved. When the negative surge is impressed to the power supply terminal 103, while the PMOS 201 becomes an OFF state, the parasitic diode 202 of the PMOS 201 functions as the back flow preventing diode, and therefore the reverse current is blocked completely.

Figure 3:
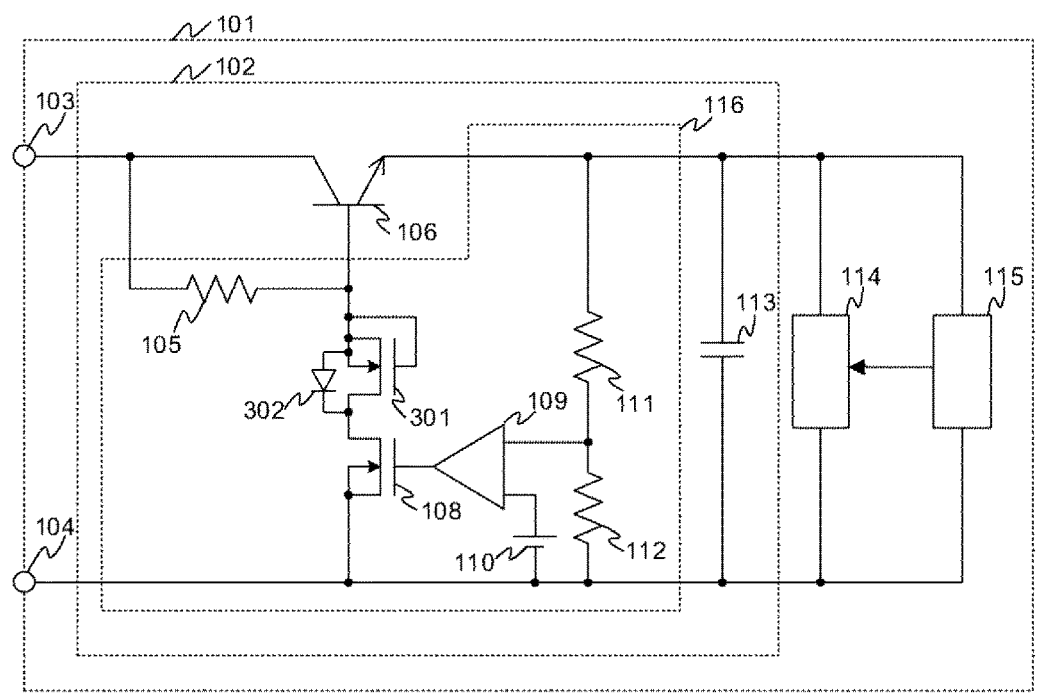
FIG. 3 is a configuration of a sensor device that forms a third embodiment.

FIG. 3 explains a sensor device that forms a third embodiment of the present invention. FIG. 3 shows a configuration of the sensor device that forms the third embodiment. The sensor device 101 in this embodiment is characterized by including a NMOS 301 in which its well and gate are connected to its drain side in place of the back flow preventing diode 107 in the sensor device 101 that forms the first embodiment. According to this configuration, it is possible to connect the base and the NMOS 108 at a lower resistance by a parasitic diode 302 of the NMOS 301 and the NMOS 301 in an ON state realizing parallel connection at the time of normal operation, and therefore to further improve the responsiveness of the regulator 102, in addition to the same effect as that of the sensor device 101 shown in the first embodiment. When the negative surge is impressed to the power supply terminal 103, while the NMOS 301 becomes an OFF state, the parasitic diode 302 of the NMOS 301 functions as a back flow preventing diode, and therefore the reverse current is blocked completely.

Figure 4:
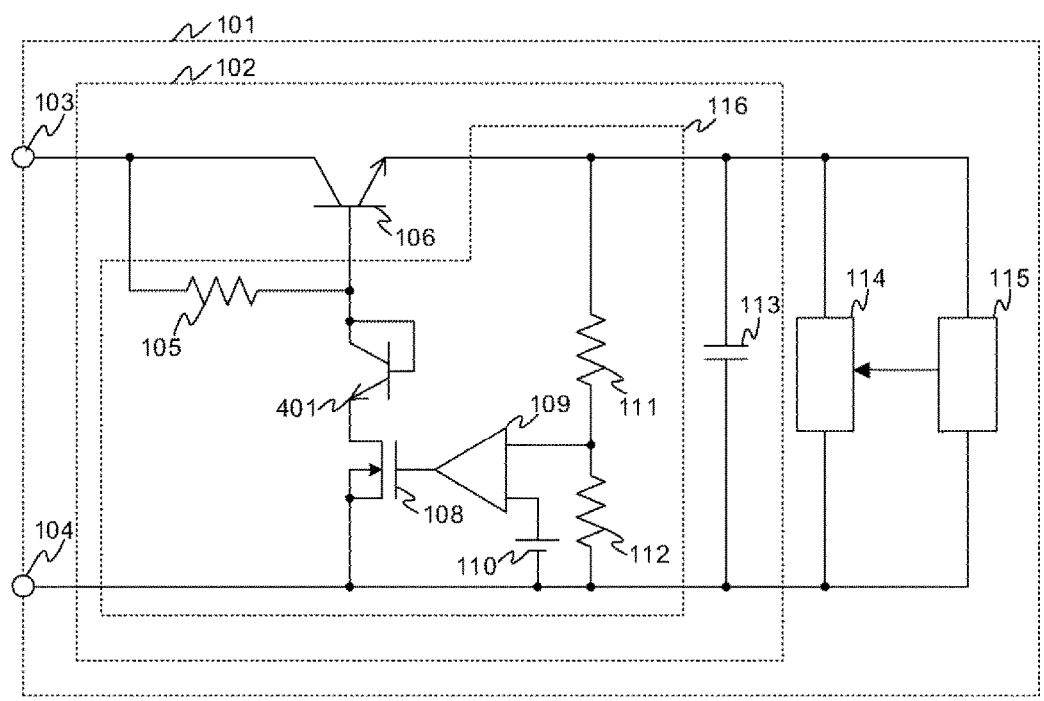
FIG. 4 is a configuration of a sensor device that forms a fourth embodiment.

FIG. 4 describes a sensor device that forms a fourth embodiment of the present invention. FIG. 4 shows a configuration of the sensor device that forms the fourth embodiment. The sensor device 101 in this embodiment is characterized by including an NPN transistor 401 whose base is connected to its collector side in place of the back flow preventing diode 107 in the sensor device 101 that forms the first embodiment. According to this configuration, at the time of normal operation, the NPN transistor 401 becomes an ON state, and it is possible to connect the base and the NMOS 108 at a lower resistance, and to further improve the responsiveness of the regulator 102, in addition to the same effect as that of the sensor device 101 shown in the first embodiment. When the negative surge is impressed to the power supply terminal 103, while the NPN transistor 401 becomes an OFF state, a diode between the base and the emitter of the NPN transistor 401 functions as the back flow preventing diode; therefore, the reverse current is blocked completely.

Figure 5:
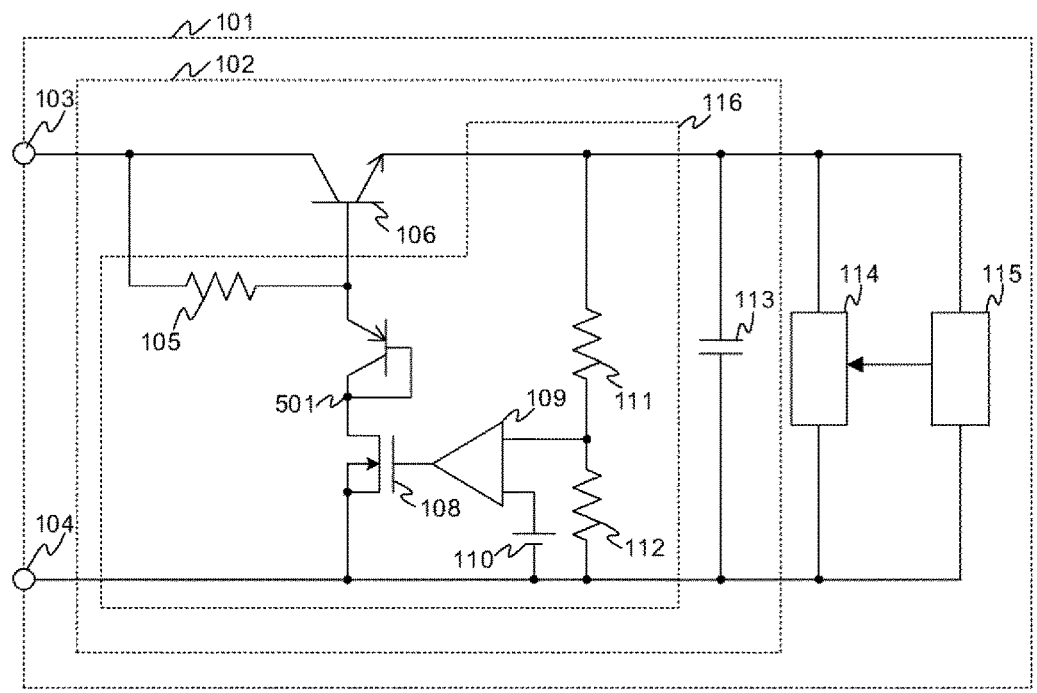
FIG. 5 is a configuration of a sensor device that forms a fifth embodiment.

FIG. 5 explains a sensor device that forms a fifth embodiment of the present invention. FIG. 5 shows a configuration of the sensor device that forms the fifth embodiment. The sensor device 101 in this embodiment is characterized by including a PNP bipolar transistor 501 whose base is connected to its collector side (hereinafter, referred to as PNP transistor) in place of the back flow preventing diode 107 in the sensor device 101 that forms the first embodiment. According to this configuration, at the time of normal operation, a PNP transistor 501 becomes an ON state, and enables the base and the NMOS 108 to be connected together at a lower resistance, which can further improve the responsiveness of the regulator 102, in addition to the same effect as that of the sensor device 101 shown in the first embodiment. When the negative surge is impressed to the power supply terminal 103, while the PNP transistor 501 becomes an OFF state, a diode between the base and the emitter of the PNP transistor 501 functions as the back flow preventing diode; therefore, the reverse current is blocked completely.

Figure 6:
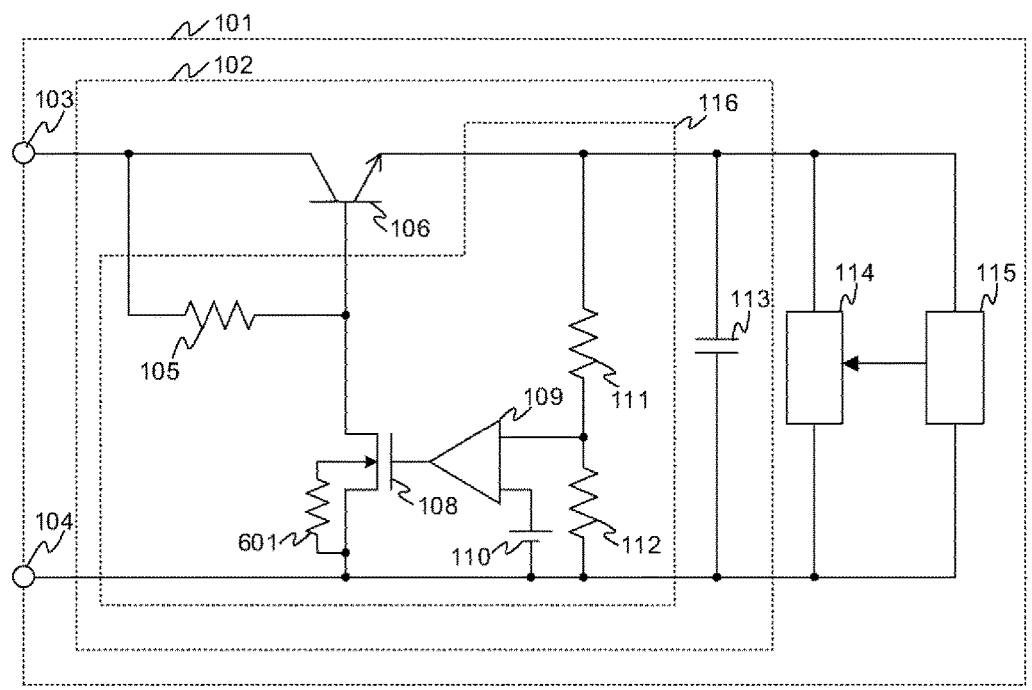
FIG. 6 is a configuration of a sensor device that forms a sixth embodiment.

A sensor device that forms a sixth embodiment of the present invention is explained with FIG. 6. FIG. 6 shows a configuration of the sensor device that forms the sixth embodiment. The sensor device 101 in this embodiment is characterized by adding a series resistance element 601 to a well of the NMOS 108 in place of the back flow preventing diode 107 in the sensor device 101 that forms the first embodiment. According to this configuration, since the reverse current flowing into the base by the resistance element 601 at the time of negative surge impression is restricted, it is possible to suppress the amount of electric charges flowing out into the collector from the emitter without addition of an active element, and to prevent the drop of the output voltage.

Figure 7:
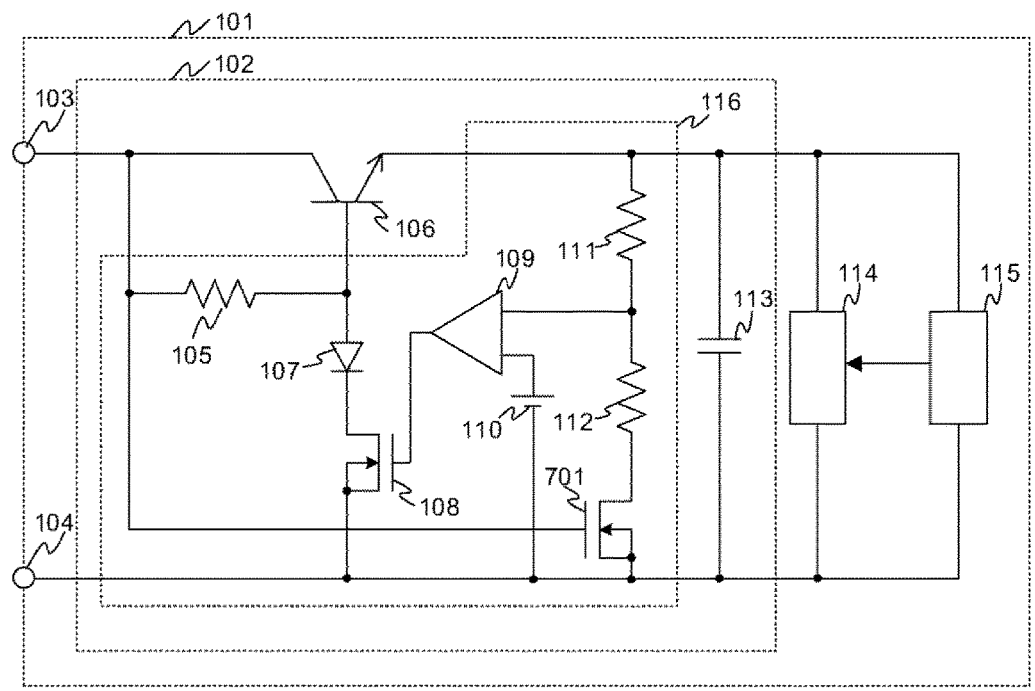
FIG. 7 is a configuration of a sensor device that forms a seventh embodiment.

A sensor device that forms a seventh embodiment of the present invention is explained with FIG. 7. FIG. 7 shows a configuration of the sensor device that forms the seventh embodiment. In the sensor device 101 in this embodiment, an NMOS 701 is added to the ground terminal side of the voltage dividing resistance 112 of the sensor device 101 that forms the first embodiment. A gate terminal of the NMOS is connected to the power supply terminal 103. At the time of normal operation, the NMOS 701 is in an ON state. In contrast, when the negative surge is impressed, since a gate potential of the NMOS 701 becomes negative, the NMOS 701 becomes an OFF state, and therefore the current flowing in the voltage dividing resistances 111, 112 can be stopped. According to this configuration, since the current flowing in the voltage dividing resistances 111, 112 is also reduced in addition to the same effect as that of the sensor device shown in the first embodiment, the sensor device 101 can maintain the output voltage Vo stably for a longer time.

Figure 12:
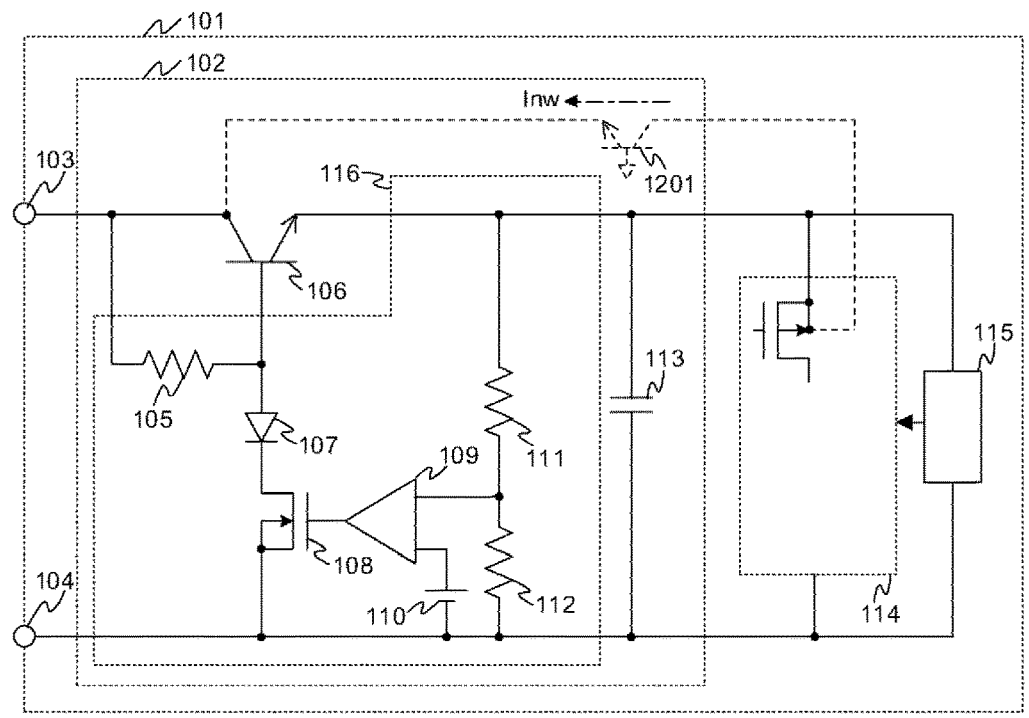
FIG. 12 is an explanatory diagram of a parasitic transistor.
Figure 13:
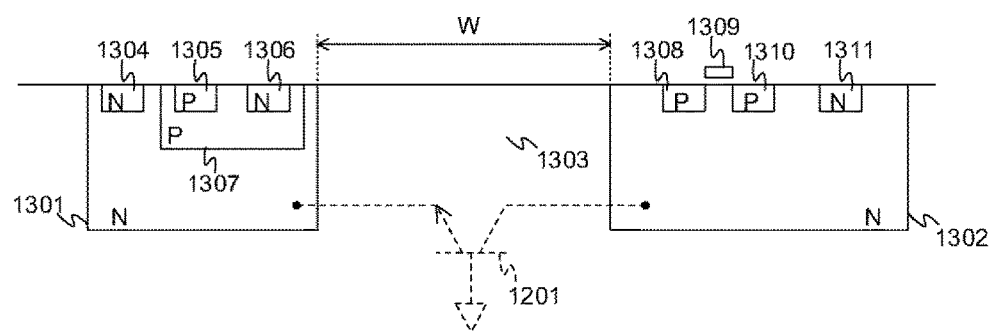
FIG. 13 is a configuration of a sensor device that forms an eighth embodiment.
Figure 14:
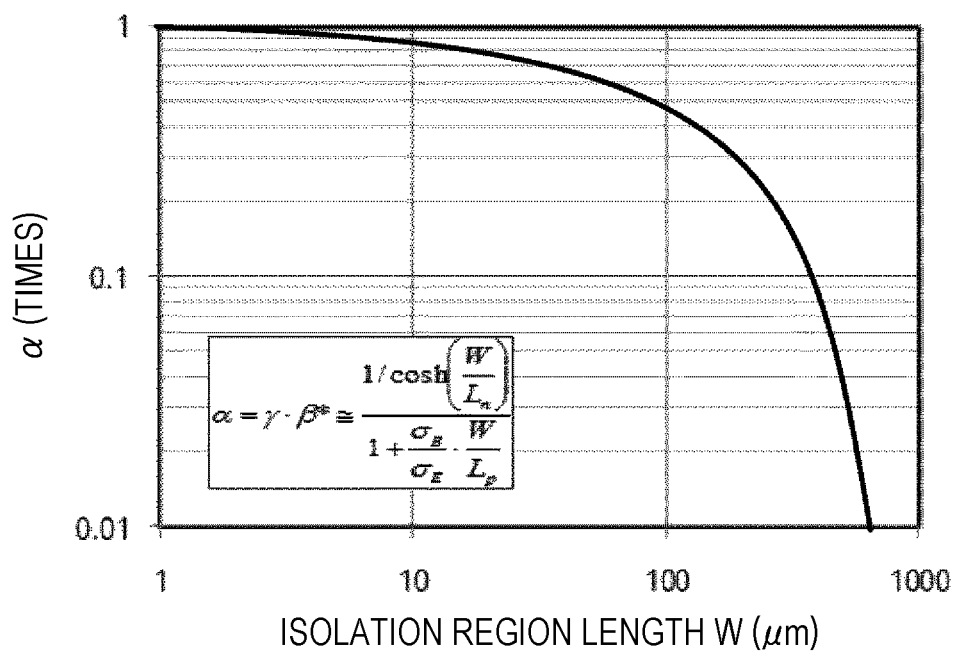
FIG. 14 is an explanatory diagram of a relation between an isolation region length and a current gain.

A sensor device that forms an eighth embodiment of the present invention is explained with FIG. 12, FIG. 13, and FIG. 14. FIG. 12 is a diagram for explaining a parasitic bipolar transistor 1201, and FIG. 13 shows a cross section of the sensor device that forms the eighth embodiment. The sensor device 101 in this embodiment is the sensor device 101 that forms the first embodiment to which an isolation region 1303 is added. First, an operation of the parasitic bipolar transistor at the time of the negative surge impression is explained using FIG. 12 and FIG. 13. The parasitic bipolar transistor 1201 is a parasitic NPN transistor that is formed with an N-type well 1302 of a PMOS included in the signal processing circuit 114, an N-type well 1301 of the NPN transistor 106 in the regulator 102, and a P substrate or a P well that exists between them. When the negative surge is impressed to the power supply terminal 103, a base current flows from the P substrate of ground potential toward an emitter of a parasitic NPN transistor 1201. As a result, the parasitic NPN transistor 1201 turns ON, a collector current Inw flows from the N-type well 1302 toward the N-type well 1301, the decoupling capacitor 113 discharges, and the output voltage +Vo drops. Therefore, in this embodiment, the isolation region 1303 is provided between the N-type well 1301 of the NPN transistor 106 and the N-type well 1302 of the PMOS in the signal processing circuit 114. At this time, a relation between a length W of the isolation region 1303 and a current gain α of the parasitic NPN transistor 1201 is expressed by the following formula.

$$\alpha = \gamma \cdot \beta^* = \frac{1/\cosh\left(\frac{W}{L_N}\right)}{1 + \frac{\sigma_B}{\sigma_E} \cdot \frac{W}{L_P}} \quad \text{[Formula 1]}$$

Here, γ is an injection efficiency of minority carriers in the case of emitter junction, β* is a direct-current gain in the case of grounded emitter, $\sigma_B$ and $\sigma_E$ are conduction ratios of the base and the emitter, respectively, and $L_N$ and $L_P$ are diffusion lengths of minority carriers in the base and the emitter, respectively. It is desirable to set the current gain α to less than or equal to 0.5 in order to prevent the parasitic NPN transistor not to make an amplifying operation as a transistor. FIG. 14 shows one example of a relation between the length W of the isolation region 1303 and the current gain α computed from the above formula. The relation between the length W of the isolation region 1303 and the current gain α varies according to a concentration of impurity and a mobility of carries, and it is desirable to secure the length W of the isolation region 1303 to be more than or equal to 100 μm in order to set the current gain α to be 0.5 or less. According to this configuration, since the current flowing out into the power supply terminal through the parasitic bipolar transistor can also be reduced in addition to the same effect as that of the sensor device 101 shown in the first embodiment, it is possible to maintain the output voltage Vo stably for a longer time.

Figure 10:
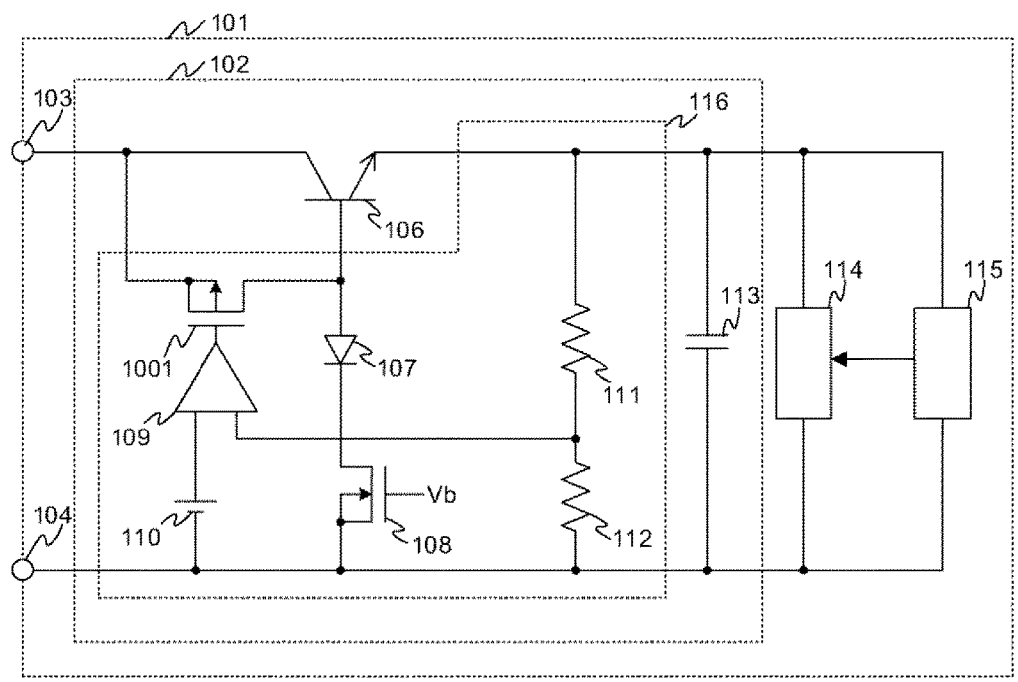
FIG. 10 is a modification of the first embodiment.
Figure 11:
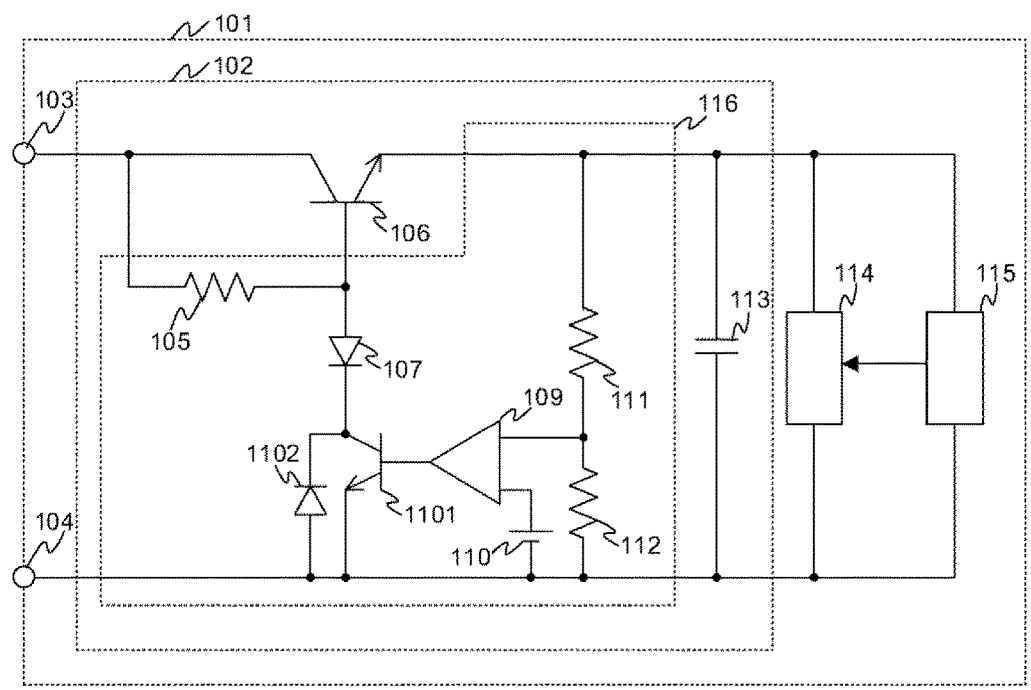
FIG. 11 is a modification of the first embodiment.

Moreover, the technology having been described so far is not limited to the configurations of the regulators in the first to eighth embodiments. For example, as shown in FIG. 10, a configuration where a base current of the NPN transistor is driven by a PMOS 1001 and the NMOS 108 may be adopted. Also in this case, since the back flow preventing diode 107 can block the current that flows from the ground terminal into the base at the time of the negative surge impression, the configuration can achieve the same effect as that of the first embodiment. Moreover, as shown in FIG. 11, also in a case where the base current of the NPN transistor 106 is controlled by another NPN transistor 1101, the back flow preventing diode 107 can block a current that flows back from the ground terminal 104 via a parasitic diode 1102 of the NPN transistor 1101.

REFERENCE SIGNS LIST

101: sensor device, 102: regulator, 103: power supply terminal, 104: ground terminal, 105: resistance, 106: NPN bipolar transistor, 107: back flow preventing diode, 108: N-type field-effect transistor, 109: error amplifier, 110: voltage reference, 111: resistance, 112: resistance, 113: decoupling capacitor, 114: signal processing circuit, 115: sensor element, 116: error detection circuit, 201: P-type field-effect transistor, 202: parasitic diode, 301: N-type field-effect transistor, 302: parasitic diode, 401: NPN bipolar transistor, 501: PNP bipolar transistor, 601: resistance, 701: N-type field-effect transistor, 801: parasitic diode, 901: emitter terminal, 902: base terminal, 903: collector terminal, 1001: P-type field-effect transistor, 1101: NPN bipolar transistor, 1102: parasitic diode, 1201: parasitic bipolar transistor, 1301: N-type well, 1302: N-type well, 1303: isolation region, 1304: collector terminal, 1305: base terminal, 1306: emitter terminal, 1307: P-type well, 1308: drain terminal, 1309: gate terminal, 1310: source terminal, 1311: well contact, Ibc: base-collector current, Iec: emitter-collector current, Inw: collector current of parasitic transistor, $L_N$, $L_P$: diffusion length, Vb: bias voltage, −Vs: negative surge voltage, +Vo: output voltage, W: isolation region length, α: current gain, β*: direct-current gain of common emitter, γ: minority carrier injection efficiency, $\sigma_B$, $\sigma_E$: conductivity

The invention claimed is:

1. A sensor device, comprising:
  a sensor element whose electric characteristics vary according to a physical quantity;
  a signal processing circuit for processing an output signal of the sensor element;
  a first transistor element for supplying currents to the sensor element and the signal processing circuit;
  a control circuit for controlling a base current of the first transistor element;
  a power supply terminal; and
  a ground terminal, wherein
    the control circuit includes a restriction part for restricting a current flowing from the ground terminal toward a base terminal of the first transistor element, and
    the first transistor element includes a first N-type well, the signal processing circuit includes a second N-type well, the sensor device includes a P-type substrate or a P-type well, and an isolation region is provided between the first N-type well and the second N-type well so that a current gain α of a parasitic bipolar transistor comprised of the first N-type well, the second N-type well, and either of the P-type substrate or the P-type well may become less than or equal to 0.5.

2. The sensor device according to claim 1, wherein the control circuit includes a second transistor element for sending a current toward the ground terminal, the restriction part includes a diode element, and the diode element connects the base of the first transistor element with its anode and connects the second transistor element with its cathode.

3. The sensor device according to claim 1, wherein the control circuit includes a second transistor element for sending a current toward the ground terminal, the restriction part includes a P-type field-effect transistor, a well, a gate, and a drain of the P-type field-effect transistor are connected to the second transistor element, and a source of the P-type field-effect transistor is connected to the base of the first transistor element.

4. The sensor device according to claim 1, wherein the control circuit includes a second transistor element for sending a current toward the ground terminal, the restriction part includes an N-type field-effect transistor, a source of the N-type field-effect transistor is connected to the second transistor element, and a well, a gate, and a drain of the N-type field-effect transistor are connected to the base of the first transistor element.

5. The sensor device according to claim 1, wherein the control circuit includes a second transistor element for sending a current toward the ground terminal, the restriction part includes an NPN transistor, an emitter of the NPN transistor is connected to the second transistor element, and a base and a collector of the NPN transistor are connected to the base of the first transistor element.

6. The sensor device according to claim 1, wherein the control circuit includes a second transistor element for sending a current toward the ground terminal, the restriction part includes a PNP transistor, a base and a collector of the PNP transistor are connected to the second transistor element, and an emitter of the PNP transistor is connected to the base of the first transistor element.

7. The sensor device according to claim 1, wherein the control circuit includes a second transistor element for sending a current toward the ground terminal, and the restriction part includes a resistance element for connecting a well of the second transistor element and the ground terminal.

8. The sensor device according to claim 1,
  wherein the control circuit includes a second transistor element for sending a current toward the ground terminal, a resistance element for voltage dividing, and a switch part,
  the switch part is connected between one end of the resistance element for voltage dividing and the ground terminal, and
  the switch part is disconnected upon detection of impression of a negative voltage to the power supply terminal.

9. The sensor device according to claim 8, wherein the switch part is an N-type field-effect transistor.

10. The sensor device according to claim 1, wherein a length of the isolation region is more than or equal to 100 μm.

* * * * *